May 30, 1967 R. W. AHRONS ETAL 3,322,974

FLIP-FLOP ADAPTABLE FOR COUNTER COMPRISING INVERTERS AND INHIBITABLE GATES AND IN COOPERATION WITH OVERLAPPING CLOCKS FOR TEMPORARILY MAINTAINING COMPLEMENTARY OUTPUTS AT SAME DIGITAL LEVEL

Filed March 14, 1966

INVENTORS
RICHARD W. AHRONS &
STANLEY KATZ
BY John V. Regan
Attorney

United States Patent Office 3,322,974
Patented May 30, 1967

3,322,974

FLIP-FLOP ADAPTABLE FOR COUNTER COMPRISING INVERTERS AND INHIBITABLE GATES AND IN COOPERATION WITH OVERLAPPING CLOCKS FOR TEMPORARILY MAINTAINING COMPLEMENTARY OUTPUTS AT SAME DIGITAL LEVEL

Richard W. Ahrons, Somerville, and Stanley Katz, East Brunswick, N.J., assignors to Radio Corporation of America, a corporation of Delaware Filed Mar. 14, 1966, Ser. No. 534,058
12 Claims. (Cl. 307—88.5)

This invention relates to digital circuitry, and in particular to triggerable flip-flop and counter circuitry especially adapted for integrated circuit structures.

As integrated circuit technology has progressed, the size of the semiconductor chips or wafers which can be made at high yield has increased. Additionally, the number of components which can be fabricated within a given area of the wafer has also increased due to reductions in component sizes. Accordingly, the number of functional circuits which can be fabricated in a semiconductor wafer has increased significantly. For example, a wafer which contained one bistable circuit can be replaced by a wafer containing several bistable circuits adapted for operation as a shift register or a binary counter. The present invention provides digital circuitry which is suited for fabrication in integrated circuit structures.

An object of this invention is to provide novel and improved triggerable flip-flop circuitry.

Another object of this invention is to provide novel and improved counter circuitry.

Still another object of this invention is to provide D.C. coupled triggerable flip-flop circuitry which utilizes field-effect transistors.

In brief, the present invention comprises a triggerable flip-flop having first and second inverters cross-coupled from the output of each to the input of the other by way of first and second normally enabled transmission gates whereby the cross-coupled inverters function as a bistable pair. The first transmission gate also normally couples the second inverter output to an input of a third inverter. A third normally inhibited transmission gate couples the third inverter output to the first inverter input. By enabling the third transmission gate and inhibiting the first and second transmission gates during a switching interval, the bistable pair is made to switch between its stable conditions in response to each trigger pulse.

In the counter embodiment of the invention, each stage includes a triggerable flip-flop similar to the one described in the previous paragraph. The third normally inhibited transmission gate of each succeeding stage is made responsive to the first and second inverter outputs of the corresponding preceding stages so that a succeeding stage changes state only when the first and second inverter outputs of the corresponding preceding stage have the same binary significance.

In the accompanying drawing, like reference characters denote like components and:

The active devices contemplated for use in practicing the present invention are preferably insulated gate field-effect transistors which have a pair of spaced-apart electrodes (source and drain) defining a conduction path and a control or gate electrode means for controlling the conductivity of the path. Such transistors may be of either the enhancement type or the depletion type. The enhancement type is of particular interest in the present application. In an enhancement type unit, the impedance of the conduction path is very high when the gate and source voltages have the same value. A signal of the proper polarity applied between the gate and source electrodes changes the impedance of the conduction path to a relatively low value.

An insulated gate field-effect transistor may be either a P-type or an N-type unit depending upon the conductivity type material of the semiconductive body. A P-type unit is one in which the majority carriers are holes; whereas, an N-type unit is one in which the majority carriers are electrons.

Figure 1:
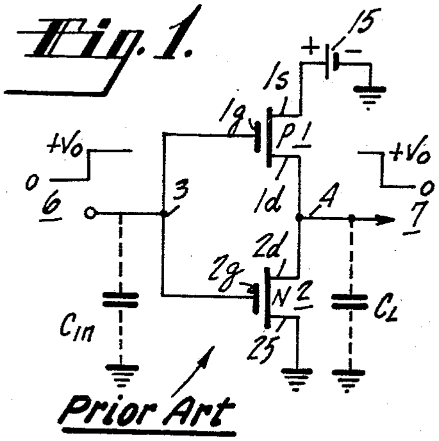
FIGS. 1 and 2 are schematic circuit diagrams of an inverter according to the prior art.
Figure 2:
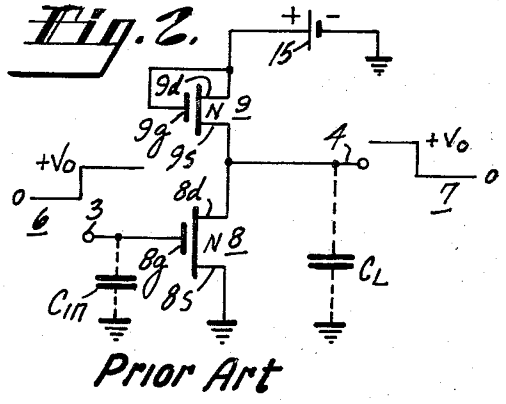

Referring now to FIGS. 1 and 2, there is illustrated two prior art inverters which may be used to implement the triggerable flip-flop and counter circuitry of the present invention. Although other inverters may be used to fabricate the flip-flop and counter circuitry of the invention in discrete form, the illustrated inverters are especially suited for integrated circuit packages which contain several of the flip-flops interconnected for operation as a counter.

Referring now to FIG. 1, a complementary symmetry inverter according to the prior art is illustrated as having a P-type transistor 1 and an N-type transistor 2. The gate electrodes 1*g* and 2*g* are connected in common to an input 3. The drain electrodes 1*d* and 2*d* are connected in common to an output 4. The source electrode 1*s* is connected to the positive terminal of a bias supply voltage, illustrated as a battery 15, the negative terminal of which is connected to circuit ground as shown by the conventional ground symbol in FIG. 1. The battery 15 is considered to have a value of $V_0$ volts. The source electrode 2*s* is also connected to circuit ground.

The input 3 and output 4 are further connected by way of an input capacitance $C_{in}$ and an output capacitance $C_L$, respectively, to circuit ground as illustrated by the dashed connections in FIG. 1. The input capacitance $C_{in}$ is representative primarily of the input capacitance of the transistors 1 and 2. The load capacitance $C_L$ is representative primarily of the input capacitance of other transistors which the inverter is driving.

As mentioned previously, the transistors of FIG. 1 are of the enhancement type. In other words, when the input waveform 6 is at a voltage of $+V_0$ volts, the source to drain conduction path of the N-type transistor 2 exhibits a low impedance whereby the capacitance $C_L$ has a charge of 0 volt. On the other hand, when the input waveform 6 is at 0 volt, the conduction path of the N-type transistor 2 exhibits a high impedance and the conduction path of the P-type transistor exhibits a relatively low impedance whereby the load capacitance $C_L$ is charged to substantially $+V_0$ volts.

The complementary symmetry inverter described above has the advantage of low standby power dissipation. Low power dissipation in the standby or steady state condition is achieved primarily because when the P-type transistor is conducting, the N-type transistor is nonconducting, and vice versa. Consequently, the load capacitance $C_L$ has a charge of either 0 volt or $+V_0$ volts. A small amount of power dissipation does occur during the standby condition due to leakage between the source and drain of a cut off transistor. However, the leakage current associated therewith is relatively small so that standby power dissipation is negligible. The only time a substantial amount of power is dissipated by the complementary inverter is during the switching transient. Because of low power dissipation, the complementary inverter is particularly suited for large-array integrated circuit packages.

Referring now to FIG. 2, another inverter according to the prior art is illustrated as having two N-type transistors 8 and 9, the transistor 9 comprising a load for the transistor 8. To this end, the gate electrode 9*g* and the drain electrode 9*d* are connected in common to the positive terminal of bias battery 15, the negative terminal of which is connected to circuit ground. The battery 15 is considered to have a value of $V_0$ volts. The source electrode 9*s* is connected to the output 4.

The output 4 is further connected to the drain electrode 8*d* of transistor 8. The source electrode 8*s* is connected to circuit ground. The gate electrode 8*g* is connected to an input 3.

The input 3 and the output 4 are further connected to circuit ground via an input capacitance $C_{in}$ and an output capacitance $C_L$, respectively, as illustrated by the dashed connections in FIG. 2. The input capacitance $C_{in}$ is representative of the input capacitance of the transistor 8; while the load capacitance $C_L$ represents the input capacitance of other transistors which the inverter is driving.

Both transistors 8 and 9 are of the enhancement type. Due to the common connection of the gate electrode 9*g* and the drain electrode 9*d* to the positive terminal of the battery 15, the transistor 9 is continually biased into conduction so that its conduction path exhibits a relatively low impedance. When the input waveform 6 is at a voltage level of 0 volt, the conduction path of the N-type transistor 8 exhibits high impedance. Current in the conventional sense flows from the positive terminal of the battery through the conduction path of transistor 9 to charge the load capacitance $C_L$ to substantially $V_0$ volts. On the other hand, when the input waveform is at a level of $+V_0$ volts, the conduction path of the N-type transistor 8 exhibits a low impedance. For this condition, current in the conventional sense flows from the positive terminal of battery 15 through the conduction paths of both transistors 8 and 9 to circuit ground. Due to the low impedance conduction path of transistor 8, the load capacitance $C_L$ has a charge of 0 volt.

It should be noted that the N-type transistors 8 and 9 may also be P-type transistors provided that the polarity of the battery 15 is reversed.

Figures 3, 5:
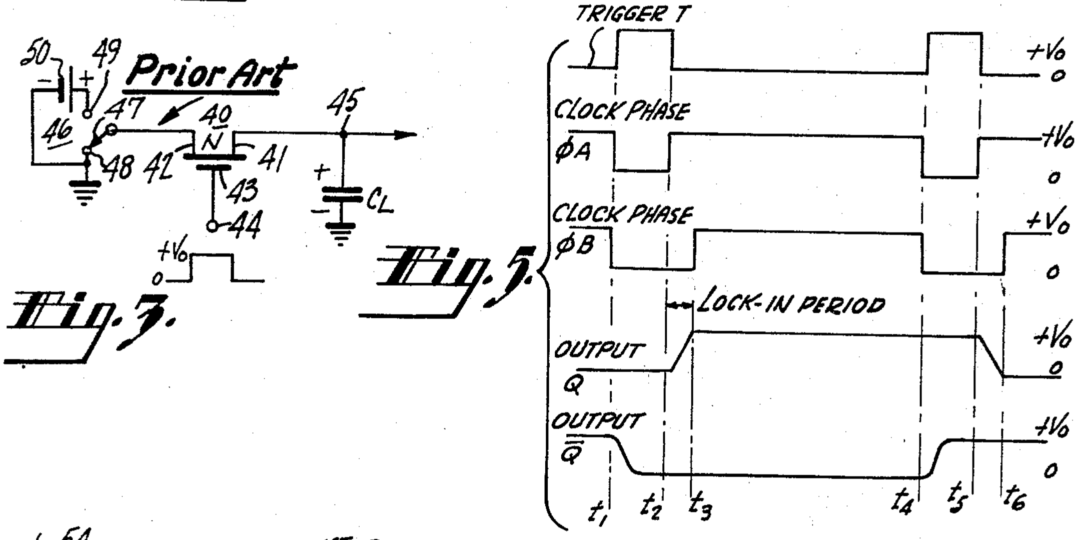
FIG. 3 is a schematic diagram of a transmission gate according to the prior art.
FIG. 5 is a waveform diagram of the trigger, control and output signals for the triggerable flip-flop of FIG. 4.

A prior art transmission gate is illustrated in FIG. 3 as an N-type field-effect transistor 40 having its gate electrode 43 connected to a terminal 44, to which is applied a control signal having a potential of either 0 volt or $+V_0$ volts. The transistor 40 has one of its source and drain electrodes 41 connected to a load capacitance $C_L$ at output terminal 45. The other of the source and drain electrodes 42 is connected to a signal source 46. The signal source 46 is illustrated, by way of example, as a switch having a switch arm 47 which may be connected either to a terminal 48 or to a terminal 49. Terminal 48 is connected directly to ground, and terminal 49 is connected to the positive terminal of battery 50, the negative terminal of the battery being grounded. Depending upon the setting of the switch arm 47, the signal source output may be a voltage level of either ground potential or $+V_0$ volts, where $V_0$ is the value of battery 50.

A field-effect transistor, such as transistor 40 is bidirectional in the sense the current can flow in either direction in the conduction path defined by the source and drain electrodes. For an N-type transistor, the source electrode generally is taken to be that electrode out of which current flows, in the conventional sense. As will become apparent, the electrode 41 may be considered the source electrode for one value of input voltage and may be considered to be the drain electrode for the other value of input voltage.

In the operation of the transmission gate, assume that capacitance $C_L$ is initially charged in the polarity direction indicated adjacent to capacitance $C_L$. Assume further that the movable switch arm 47 is connected to the grounded terminal 48. Transistor 40 is biased off when its gate voltage is at ground potential. When the control voltage at gate electrode 43 is then changed to $+V_0$ volts, transistor 40 is rendered conducting. For the voltage conditions given, the transistor 40 operates as a grounded source transistor, wherein electrode 42 is the source electrode and electrode 41 is the drain electrode. Because the source is grounded directly, a constant potential difference of $V_0$ volts exists between the source electrode 42 and the gate electrode 43; and the transistor remains biased in a low impedance (high conductivity) state so long as the input and gate voltages remain at these values. Therefore, the load capacitance $C_L$ is able to fully discharge through the conduction path of the transistor 40 such that the voltage at output terminal 45 changes to ground potential or 0 volt.

When the control voltage at gate electrode 43 is changed from $+V_0$ volts to ground potential, transistor 40 then becomes nonconducting and the load capacitance $C_L$ remains at a charge of substantially 0 volt. Let it be assumed now that the switch arm 47 is in contact with terminal 49 such that the input voltage is $+V_0$ volts. When the control voltage at gate electrode 43 is again changed to $+V_0$ volts, a potential difference of $V_0$ volts exists between the gate electrode 43 and the electrode 41 whereby the electrode 41 is now the source electrode. Accordingly, transistor 40 now operates as a source follower. Current flows in the positive terminal of the battery 50 through the conduction path of the transistor 40 and to the load capacitance $C_L$. The load capacitance $C_L$ becomes charged to a value of $V_0-V_T$, where $V_T$ is the threshold voltage required for conduction in the transistor. The threshold voltage $V_T$ is generally small compared to the input voltage $V_0$ so that the capacitance $C_L$ can be said to be charged to substantially $V_0$ volts.

Figure 4:
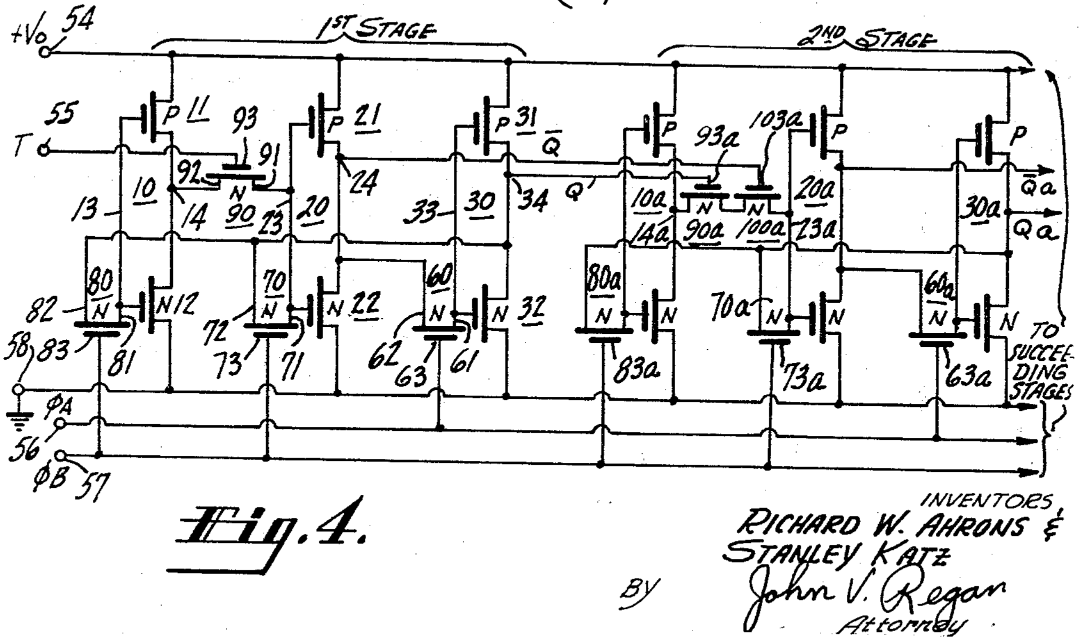
FIG. 4 is a schematic diagram of a triggerable flip-flop and binary counter circuit which embody the present invention.

Referring now to FIG. 4, a triggerable flip-flop according to the present invention is illustrated in a multistage binary counter of which only the first and second stages are shown. The first stage triggerable flip-flop includes four transmission gates 60, 70, 80 and 90 and three inverters 10, 20 and 30 having circuit configurations substantially identical to the circuit configuration of the FIG. 1 inverter. The selection of the FIG. 1 inverter to describe the flip-flop and counter circuitry of the invention is arbitrary and should not prejudice the use of the FIG. 2 inverter or any other inverter. Like circuit components in the three inverters are identified by reference characters of which the tens digit denotes the particular inverter in which the circuit component is located and the units digit denotes the particular circuit component in correspondence with the FIG. 1 inverter. Likewise, the transmission gates 60, 70, 80 and 90 are similar to the transmission gate transistor 40 of FIG. 2 and a similar set of reference characters is utilized.

The inverters 10, 20 and 30 are interconnected by way of transmission gate transistors 60, 70, 80 and 90. The inverters 20 and 30 are cross-coupled from the output of each to the input of the other by way of the conduction paths of transistors 60 and 70 for operation as a bistable pair. To this end, the conduction path of transistor 60 is connected between the output 24 and the input 33 and the conduction path of transistor 70 is connected between the output 34 and the input 23. The output 34 is also connected by way of the conduction path of transistor 80 to the input 13 of inverter 10. The inverter 10 can be regarded as an input inverter to the bistable pair of inverters 20 and 30. The output 14 of inverter 10 is connected to the input 23 of inverter 20 by way of the conduction path of transistor 90.

The gate electrode 63 of transistor 60 is connected to a terminal 56 to which are applied control signals $\phi_A$. The gate electrodes 73 and 83 of transistors 70 and 80 are connected to a terminal 57 to which are applied control signals $\phi_B$. The gate electrode 93 of transistor 90 is connected to a terminal 55 to which are applied trigger signals T. In addition, the source electrodes of the P-type transistors in each inverter are connected in common to a terminal 54 to which is applied a bias supply voltage having a value of $+V_0$ volts. The source electrodes of the N-type transistors in each inverter are connected in common to a grounded terminal 58.

The normal or standby operation of the flip-flop is defined for the conditions of the trigger signal T equal to 0 volt and the control signals $\phi_A$ and $\phi_B$ equal to $+V_0$ volts, which conditions exist just prior to time $t_1$ in the waveform diagram of FIG. 5. Under these conditions, the flip-flop can be in either one of two stable states. In a first stable state, the output signals Q and $\overline{Q}$ developed at the outputs 34 and 24 are at 0 volt and $+V_0$ volts, respectively. With control signals $\phi_A$ and $\phi_B$ being at $+V_0$ volts, the transmission gate transistor 60 is enabled and operative in the source follower mode whereby the input capacitance of the inverter 30 has a charge of $+V_0$ volts. Also with the control signal $\phi_B$ being $+V_0$ volts, the transmission gate transistors 70 and 80 are enabled and operative in the grounded source mode whereby the input capacitances of the inverters 10 and 20 have a charge of 0 volt. Consequently, the transmission gates 60 and 70 function to permanently lock the bistable pair of inverters 20 and 30 in the first stable state. Also for this first stable state condition the output 14 of the input inverter 10 is substantially $+V_0$ volts. During the standby condition, the output 14 is isolated from the input 23 of inverter 20 by transmission gate transistor 90 since the trigger signal T has a value of 0 volt.

In the second stable state, the output signals Q and $\overline{Q}$ are at $+V_0$ volts and 0 volt, respectively. Transmission gate transistor 60 is operative in the grounded source mode whereby the input capacitance of the inverter 30 has a charge of 0 volt; while the transmission gate transistors 70 and 80 are operative in the source follower mode whereby the input capacitances of the inverters 10 and 20 have a charge of substantially $+V_0$ volts. Again, the transmission gate transistors 60 and 70 permanently lock the bistable inverter pair into the second stable state. The input inverter output 14 is at 0 volt and is again isolated by the cut off transistor 90 from the input 23 of inverter 20.

The operation of the triggerable flip-flop in response to trigger signals will now be described. Let it be assumed that just prior to time $t_1$ the flip-flop is in its first stable state wherein the output signals Q and $\overline{Q}$ have values of 0 and $+V_0$ volts, respectively. At time $t_1$, a trigger signal T having a value of $+V_0$ volts is applied to the gate electrode 93 of transmission gate transistor 90 thereby enabling the transistor to operate in the source follower mode to charge the input capacitance of the inverter 20 to substantially $+V_0$ volts. As the input capacitance of inverter 20 charges, the inverter output 24 changes from $+V_0$ volts to 0 volt.

Also at time $t_1$, the control or clock signals $\phi_A$ and $\phi_B$ change to 0 volt and inhibit or turn off the transmission gate transistors 60, 70 and 80. The inhibited or cut off transistor 60 isolates the input capacitance of the inverter 30 from the change in signal condition at the output 24 of inverter 20. In other words, the large impedance presented by the conduction path of transistor 60 prevents the input capacitance of inverter 30 from becoming discharged. This isolation is limited in time by the leakage current of the transistor 60. The leakage current can be controlled in fabrication of the circuit devices so that the time constants associated therewith are large as compared to the switching times of the inverters. The trigger pulse and the clock signal pulse $\phi_A$ are terminated at a time $t_2$ which yields a time period greater than the switching time of the inverter 20 but considerably less than the time constant associated with the leakage current of the cut off transistor 60.

At time $t_2$, the trigger signal returns to a value of 0 volt thereby inhibiting the transistor 90 and the clock signal $\phi_A$ returns to a value of $+V_0$ volts thereby enabling the transistor 60. At this time, transmission gate 60 is operative in the grounded source mode to discharge the input capacitance of inverter 30 to substantially 0 volt. As this input capacitance discharges, the output signal Q at output 34 changes from 0 to $+V_0$ volts by time $t_3$. The clock signal $\phi_B$ remains at 0 volt so that transistors 70 and 80 isolate the changing signal condition at the output 34 of inverter 30 from the input capacitances of inverters 10 and 20. Thus, during the lock in period from time $t_2$ to $t_3$ the flip-flop becomes permanently locked in its second stable state.

At time $t_3$ when the clock signal $\phi_B$ returns to the value of $+V_0$ volts, the transmission gate transistors 70 and 80 are enabled and are operative in the source follower mode to charge the input capacitance of inverter 10 to substantially $+V_0$ volts and to retain the charge of substantially $+V_0$ volts on the input capacitance of the inverter 20. Thus, the triggerable flip-flop is switched from its first to its second stable state during the switching interval defined by times $t_1$ and $t_3$ in response to the first trigger pulse.

The next trigger pulse applied between times $t_4$ and $t_5$ is similarly operative to switch the flip-flop from its second stable state back to its first stable state. To this end, the transistor 90 becomes enabled and operative in the grounded source mode to discharge the input capacitance of the inverter 20 to 0 volt. The output signal $\overline{Q}$ at inverter output 24 changes from 0 volt to $+V_0$ volts. The cut off transistor 60 again isolates the change in signal condition at output 24 from the input capacitance of the inverter 30. During the lock in period from time $t_5$ to $t_6$, the transistor 60 becomes enabled and operative in the source follower mode to charge the input capacitance of inverter 30 to substantially $+V_0$ volts. At time $t_6$, the clock signal $\phi_B$ returns to $+V_0$ volts to enable transistors 70 and 80 to operate in the grounded source mode for discharging the input capacitance of inverter 10 and retaining the discharge condition of the input capacitance of inverter 20.

The next succeeding trigger pulse switches the triggerable flip-flop in the same manner as the first trigger pulse which was applied during the first switching interval from $t_1$ to $t_3$. The following trigger pulse again switches the flip-flop in the same manner as the second trigger pulses applied during the time interval from $t_5$ to $t_6$.

The above described triggerable flip-flop is useful for binary counter applications. For example, if the binary bits "1" and "0" are assigned (arbitrarily) to the voltage values of $+V_0$ volts and 0 volt, respectively, the flip-flop Q and $\overline{Q}$ outputs give a "1" bit in response to alternate trigger pulses. In other words, the $\overline{Q}$ output according to the above described flip-flop operation has a binary "1" value in response to every two applied trigger pulses.

As illustrated in FIG. 4, the triggerable flip-flop thus far described is connected as the first stage of a multistage binary counter. The second illustrated stage of the counter is substantially similar to the first stage and like reference characters followed by the letter *a* denote like components. Like the first stage flip-flop, the inverters 10*a*, 20*a* and 30*a* are connected between the bias supply and ground lines extending to the right from the terminals 54 and 58. Also the gate electrode 63*a* is connected to the clock *a* line extending to the right of the terminal 56 while the gate electrodes 73*a* and 83*a* are connected to the clock *b* line extending to the right of terminal 57. These aforementioned lines and the second stage output line identified by the outputs Q*a* and $\overline{Q}a$ are illustrated as extending to succeeding stages of the counter.

The second stage and all of the succeeding stages differ from the first stage flip-flop in that the transmission gate transistor 90 is replaced by two transmission gates 90*a* and 100*a* (second stage) having their conduction paths connected in series between the output 14*a* of inverter 10*a* and input 23*a* of inverter 20*a*. The gate electrodes 93*a* and 103*a* are connected to receive the output signals Q and $\overline{Q}$, respectively, of the first stage triggerable flip-flop.

The operation of the second stage flip-flop is substantially similar to the operation of the first stage flip-flop. However, the second stage flip-flop can be triggered only when both of the first stage output signals Q and $\overline{Q}$ have a value of $+V_0$ volts so that both of the transmission gates 90*a* and 100*a* are enabled to charge or discharge, as the case may be, the input capacitance of the inverter 20*a*. In other words, the second stage can be triggered only when the first stage output signals Q and $\overline{Q}$ have the same binary significance. This condition of the output signals Q and $\overline{Q}$ occurs only during every other switching interval. Assuming that the second stage output signals Q*a* and $\overline{Q}a$ initially have values of 0 and $+V_0$ volts, respectively. Refer now to FIG. 5. The first stage output signals Q and $\overline{Q}$ do not both have a value of $+V_0$ volts during the first switching interval from time $t_1$ to $t_3$. During the next switching interval from time $t_4$ to time $t_6$, the output signals Q and $\overline{Q}$ both have a value of $+V_0$ volts so that the transmission gates 90*a* and 100*a* in the second stage flip-flop are enabled to switch the second stage flip-flop. The first stage output signals Q and $\overline{Q}$ do not again both become $+V_0$ volts until the fourth trigger pulse is applied to the first stage. Consequently, the second stage output Q*a* and $\overline{Q}a$ has a value of $+V_0$ volts in response to every fourth applied trigger pulse.

There has been described triggerable flip-flop and binary counter circuitry utilizing insulated gate field-effect transistors. As mentioned previously, inverters other than the illustrated complementary symmetry type may be used in the triggerable flip-flop. In addition, the transmission gates could be P-type instead of N-type transistors provided that appropriate values of trigger signals T and control or clock signals $\phi_A$ and $\phi_B$ are applied thereto.

What is claimed is:

1. A triggerable flip-flop comprising
first, second and third inverters each having input and output means,
first normally enabled gate means for coupling the output means of said third inverter to the input means of said first and second inverters,
second normally enabled gate means for coupling the output means of said second inverter to the input means of said third inverter, whereby said second and third inverters are operable as a bistable pair,
third normally inhibited gate means for coupling the output means of said first inverter to the input means of said second inverter,
trigger signal means for enabling said third gate means for a portion of a switching interval, and
control signal means for inhibiting said second gate means when said third gate means is enabled for at least said switching interval portion and for inhibiting said first gate means for the entirety of said switching interval, whereby said bistable pair is switched from one to the other of its stable states.

2. The triggerable flip-flop according to claim 1
wherein said first gate means includes first and second field-effect transistors each having a conduction path, the conduction path of said first transistor being connected between said third inverter output and said first inverter input and the conduction path of said second transistor being connected between said third inverter output and said first inverter input, and
wherein said control signal means causes said conduction paths to have high impedance for the entirety of said switching intervals.

3. The triggerable flip-flop according to claim 2 wherein said second and third gate means include third and fourth field-effect transistors, respectively, each having a conduction path, the conduction path of said third field-effect transistor being connected between said second inverter output and said third inverter input and the conduction path of said fourth field-effect transistor being connected between said first inverter output and said second inverter input, and
wherein said control signal means causes said third transistor conduction path to have high impedance during said switching interval portion and said trigger signal means causes said fourth transistor conduction path to have low impedance during said switching interval portion.

4. The triggerable flip-flop according to claim 3
wherein each of said field-effect transistors has a gate electrode for controlling the conductivity of the associated conduction path, the gate electrode of said fourth field-effect transistor being coupled to said trigger signal means and the remainder of said gate electrodes being coupled to said control signal means.

5. The triggerable flip-flop according to claim 4
wherein each of said inverters is a complementary field-effect transistor inverter.

6. The triggerable flip-flop according to claim 4
wherein each of said inverters includes an inverting and a load field-effect transistor of the same conductivity type.

7. A multistage counter
wherein each stage comprises a triggerable flip-flop according to claim 1,
wherein the trigger signal means of the second stage includes the second and third inverter output means of the first stage triggerable flip-flop.

8. A counter according to claim 6
wherein in the first stage, the third gate means includes a field-effect transistor having a conduction path connected between the first inverter output and the second inverter input and having a gate electrode coupled to the trigger signal means; and
wherein in the second stage, the third gate means includes two field-effect transistors each having a conduction path connected in series with one another and between the first inverter output and the second inverter input, said two field-effect transistors each having gate electrodes coupled to the first stage second and third inverter outputs.

9. The invention according to claim 5
wherein said trigger signal means applies a trigger pulse during said switching interval portion to the gate electrode of said fourth field-effect transistor, and
wherein said control signal means applies a first control pulse to the gate electrodes of said first and second field-effect transistors and a second control pulse to the gate electrode of said third field-effect transistor during said switching interval, the duration of said first control pulse lasting throughout the switching interval, while the duration of said second control pulse lasts only during said portion of the interval.

10. A counter in combination with a source of digital signals having a first binary significance during switching intervals and a second binary significance therebetween, said counter comprising
a preceding and a succeeding bistable stage each having an input means and a pair of outputs, the outputs of said preceding stage being coupled to the input means of said succeeding stage,
means for coupling said digital signals to the input means of said preceding stage, and
control signal means for enabling said preceding stage to change between its stable states in response to said digital signals during said switching intervals, said preceding stage including means responsive to said control signal means for temporarily maintaining both of said preceding stage outputs at a signal level of said first binary significance for a portion of every other switching interval during which said preceding stage changes state, said control signal means further enabling said succeeding stage to change between its stable states when said preceding stage outputs are both temporarily of said first binary significance.

11. The counter as claimed in claim 10 wherein said preceding stage is the first stage of the counter and its corresponding input means is connected to said source of digital signals, wherein said first stage includes means for changing its state in response to each digital signal of the first binary significance so that said first stage outputs are temporarily of said first binary significance during alternate switching intervals, wherein said succeeding stage is the second stage of the counter wherein said second stage includes means for changing its state during said alternate switching intervals when said first stage outputs are temporarily of said first binary significance.

12. A triggerable flip-flop comprising first, second and third inverters each having input and output means, first normally enabled gate means for coupling the output means of said third inverter to the input means of said first and second inverters, second normally inhibited gate means for coupling the output means of said first inverter to the input means of said second inverter, third means for coupling the output means of said second inverter to the input means of said third inverter whereby said second and third inverters are operable as a bistable pair, and signal means operable during switching intervals to enable said second gate means and to inhibit said first gate means thereby switching said bistable pair from one to the other of its stable states.

References Cited

UNITED STATES PATENTS 3,284,645 11/1966 Etchelberger et al. ___ 307—88.5
3,284,782 11/1966 Burns _____________ 307—88.5

ARTHUR GAUSS, *Primary Examiner.*

J. S. HEYMAN, *Assistant Examiner.*